(12) United States Patent
Yang et al.

(10) Patent No.: US 7,388,747 B2
(45) Date of Patent: Jun. 17, 2008

(54) HEAT PLATE FIXING STRUCTURE

(75) Inventors: Chih-Kai Yang, Taipei (TW); Feng-Ku Wang, Taipei (TW)

(73) Assignee: Inventec Corporation, Taipei (TW)

( * ) Notice: Subject to any disclaimer, the term of this patent is extended or adjusted under 35 U.S.C. 154(b) by 131 days.

(21) Appl. No.: 11/399,453

(22) Filed: Apr. 7, 2006

(65) Prior Publication Data

US 2007/0236886 A1     Oct. 11, 2007

(51) Int. Cl.
    *H05K 7/20*     (2006.01)
(52) U.S. Cl. .................. 361/700; 361/704; 361/719; 257/715; 257/718; 257/719; 174/15.2; 165/80.4
(58) Field of Classification Search .................. None
    See application file for complete search history.

(56) References Cited

U.S. PATENT DOCUMENTS

| | | | |
|---|---|---|---|
| 5,648,889 A * | 7/1997 | Bosli | 361/704 |
| 5,982,622 A * | 11/1999 | Chiou | 361/704 |
| 6,105,215 A * | 8/2000 | Lee | 24/458 |
| 6,116,331 A * | 9/2000 | Tustaniwskyj et al. | 165/80.4 |
| 6,134,112 A * | 10/2000 | LeCornu et al. | 361/720 |
| 6,271,058 B1 * | 8/2001 | Yoshida | 438/108 |
| 6,366,460 B1 * | 4/2002 | Stone et al. | 361/687 |
| 6,507,981 B1 * | 1/2003 | Bosak et al. | 24/457 |
| 6,545,352 B1 * | 4/2003 | Ruckdeschel | 257/718 |
| 6,625,022 B2 * | 9/2003 | Frutschy et al. | 361/700 |
| 6,644,396 B2 * | 11/2003 | Liang | 165/185 |
| 6,646,881 B1 * | 11/2003 | Lai et al. | 361/719 |
| 7,277,288 B2 * | 10/2007 | Lee et al. | 361/704 |
| 2007/0008703 A1 * | 1/2007 | Park et al. | 361/704 |

* cited by examiner

*Primary Examiner*—Boris L Chervinsky
(74) *Attorney, Agent, or Firm*—Harness, Dickey & Pierce, P.L.C.

(57) ABSTRACT

A heat plate fixing structure is provided, suitable for being used in the heatsink structure of the heating element for an electronic device, which is provided with a support part and a fixing piece, wherein the fixing piece is fixed onto the internal side of the top plate of the support part, pressing against the heat plate, such that the heat plate and the heating element are tightly attached to each other, thereby achieving good heat conductive integration.

10 Claims, 5 Drawing Sheets

HEAT PLATE FIXING STRUCTURE

BACKGROUND OF THE INVENTION

1. Field of Invention

The present invention relates to a heat plate fixing structure, and more particularly to a heat plate fixing structure used in the heatsink structure of the heating element for an electronic device.

2. Related Art

With the progress of information technology, the computer has become widely used. Along with the ever-enhancing operating functionality and speed of electronic elements, such as the central processing unit (CPU) or display chip of a computer, the problem of high temperature occurs due to the high-speed or mass operations of the electronic elements. As the working temperature of each electronic element is limited to some extent, a high temperature may not only affect the work efficiency of electronic elements, but also cause problems, such as damage to or even burning of the electronic elements. Therefore, the problem of heat dissipation has become an indispensable part of that which is to be solved during the product design. To make a computer work normally under a normal temperature, a heatsink has become a necessary means for the computer.

An ordinary circuit structure of a computer takes a CPU and a display chip as the main operation units. The high temperature resulted from the high-speed or mass operations of CPU or display chip is indeed an important subject to be overcome as for a notebook computer. However, as the notebook computer is limited to be light in weight, compact in size, and limited in the internal space, how to effectively utilize the space becomes extremely important in the circuit design and the layout arrangement of the internal mechanism.

As shown in FIG. 1, it is a conventional heat plate fixing device 70, wherein each of the fixing plates 71 is supported by a foot rest 72, and then installed by pressing against the middle of the heat plate via a single point; therefore, the force is non-uniformly applied to the heat plate due to the over-concentration of the force-applying point. The structural design of the fixing plate 71 pressing against the middle of the heat plate via a single point also results in the situation that the heat plate cannot be steadily integrated with and tightly attached to the heating element, thereby causing problems, such as unsteady structure and poor heat conduction, etc.

SUMMARY OF THE INVENTION

The present invention provides a heat plate fixing structure with a support part and a fixing piece, applied to the heatsink structure of the heating element for an electronic device, wherein the fixing piece is fixed onto the internal side of the top plate of the support part, further pressing against the heat plate, such that the heat plate and the heating element are attached to each other tightly, thereby achieving good heat conductive integration.

To fulfill the above object, the present invention provides a heat plate fixing structure, applied to the heatsink structure of the heating element for an electronic device, wherein the heatsink structure at least includes a heat plate and at least one heat pipe. The heat plate fixing structure includes a support part and at least one fixing piece.

The support part is of an inverted U-shaped structure, provided with a top plate and a side plate respectively formed at both sides of the top plate. The support part is disposed across both sides of the support part and is fixed onto the circuit board or the body of the electronic device. The fixing piece is an elastic sheet with the top end fixed onto the internal side of the top plate, and the fixing piece is pressed against the four sides of the upper surface of the heat plate, such that the heat plate and the heating element are attached to each other tightly.

The present invention further provides a heat plate fixing structure, applied to the heatsink structure of the heating element for an electronic device, wherein the heatsink structure at least includes a heat plate and at least one heat pipe. The heat plate fixing structure includes a support part with a bracket, and at least one fixing piece.

The support part with a bracket is provided with a top plate, side plates respectively formed at both sides of the top plate, and a bracket formed at one side of the side plates. The support part is disposed across the external side of the heat plate and is fixed onto the circuit board or the body of the electronic device. The at least one fixing piece is an elastic sheet with the top end fixed onto the internal side of the top plate, and the fixing piece presses against the upper surface of the heat plate, such that the heat plate and the heating element are attached to each other tightly.

Through implementing the present invention, at least the following functions can be achieved:

First, the forces are uniformly applied to the heat plate, such that it can be integrated with the heating element with more steady heat conductivity.

Second, the stability of the structure can be improved through the structural operation with multiple force-applying points.

To further understand the objects, structural features, and functions of the present invention, it will be illustrated in detail below with reference to the embodiments and accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

The First Embodiment

Figure 1:
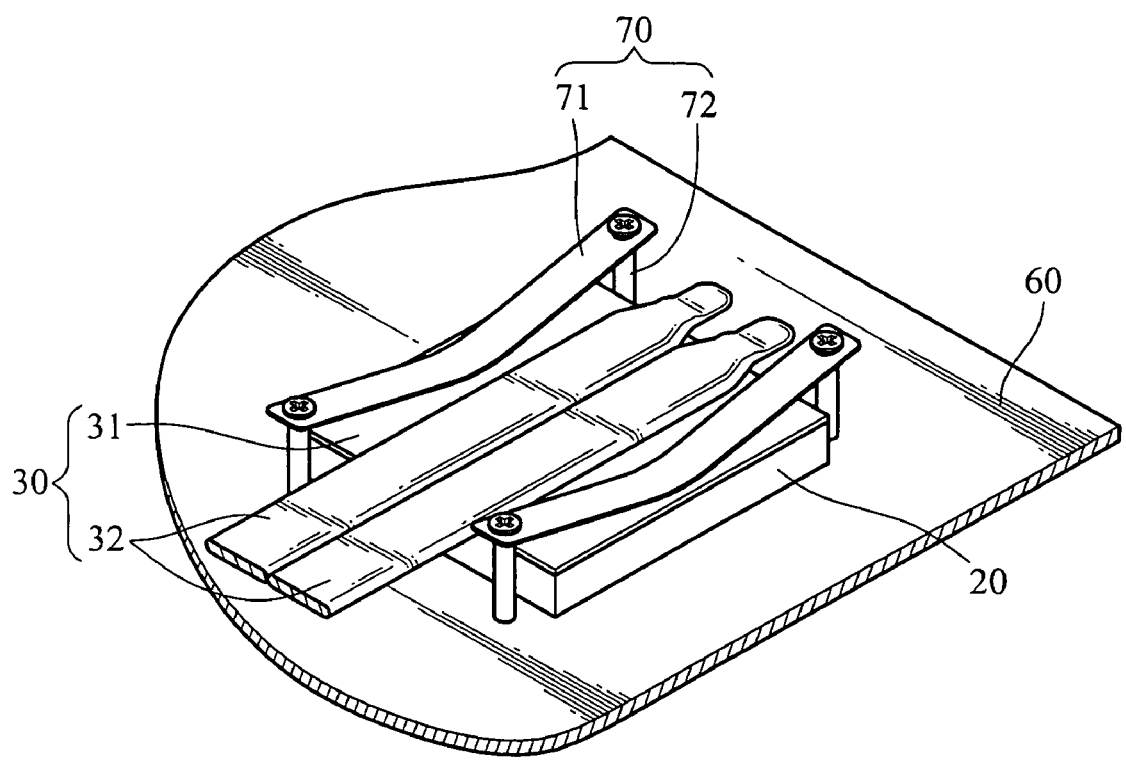
FIG. 1 is a conventional heat plate fixing device.
Figure 2:
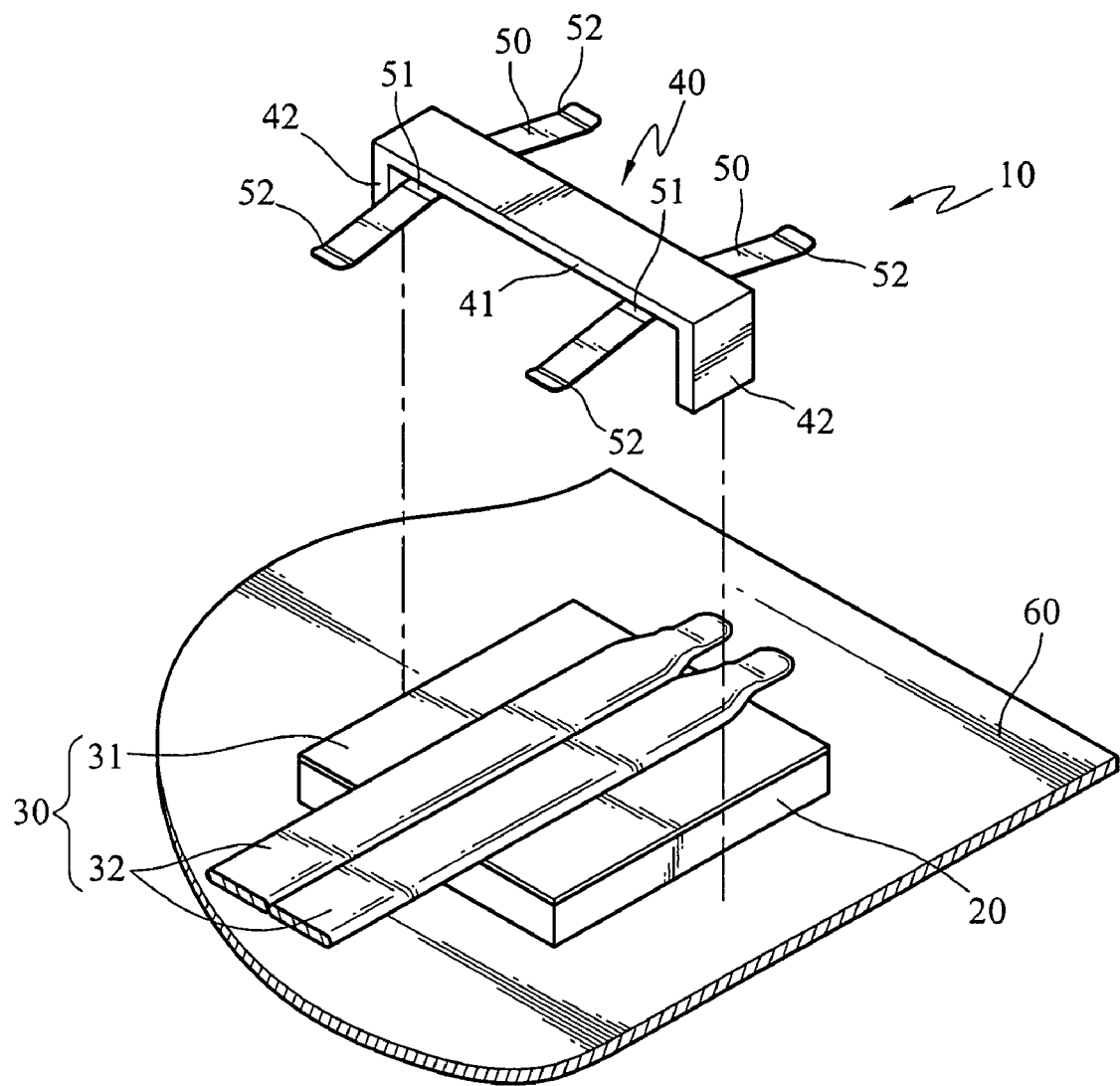
FIG. 2 is an exploded stereogram of a heat plate fixing structure according to a first embodiment of the present invention.
Figure 3:
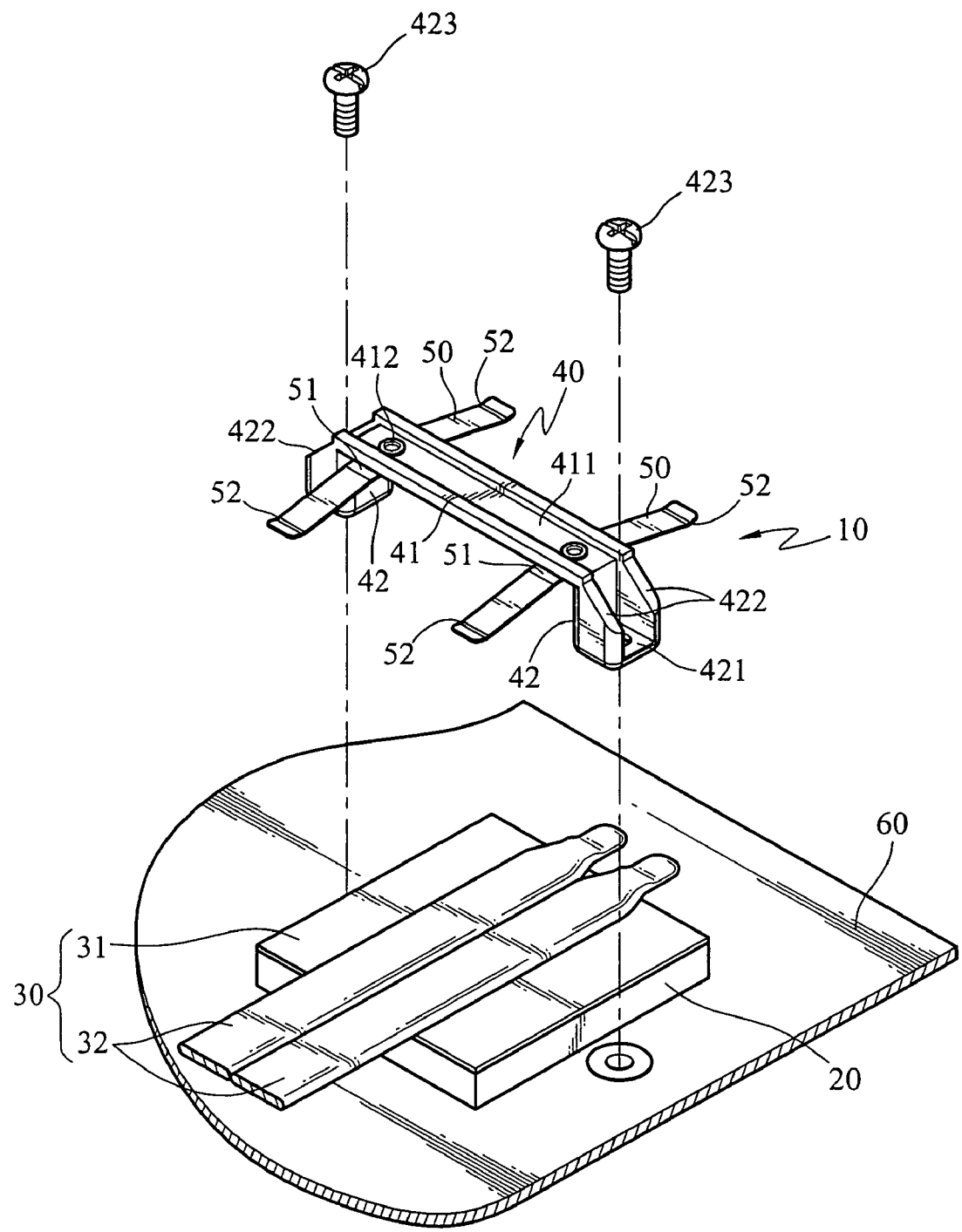
FIG. 3 is an exploded stereogram of an embodiment of the heat plate fixing structure of FIG. 2 further provided with a reinforcing plate.
Figure 4:
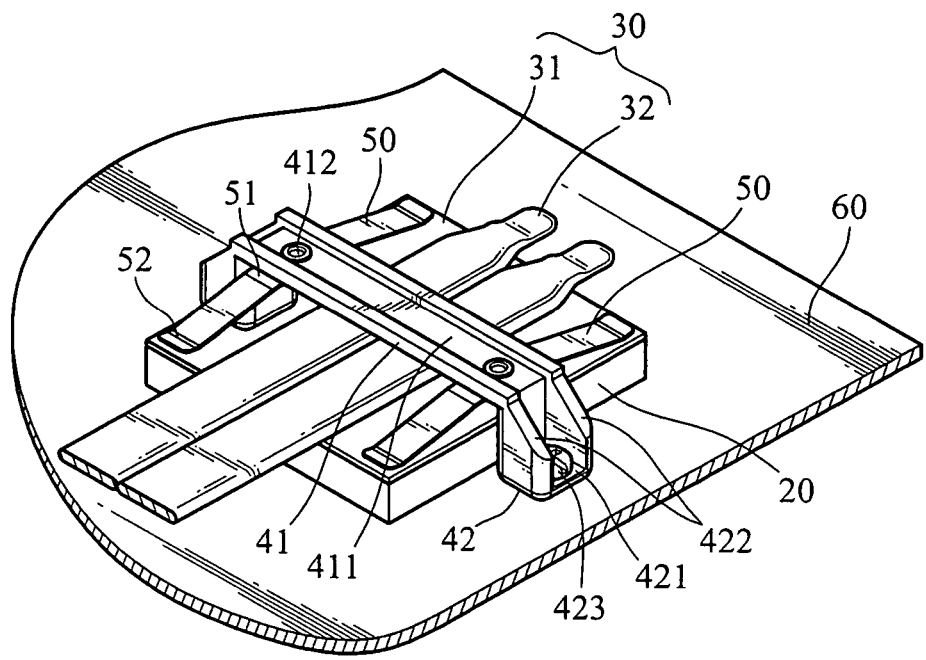
FIG. 4 is an integrated stereogram of a heat plate fixing structure according to an embodiment of the present invention.
Figure 5:
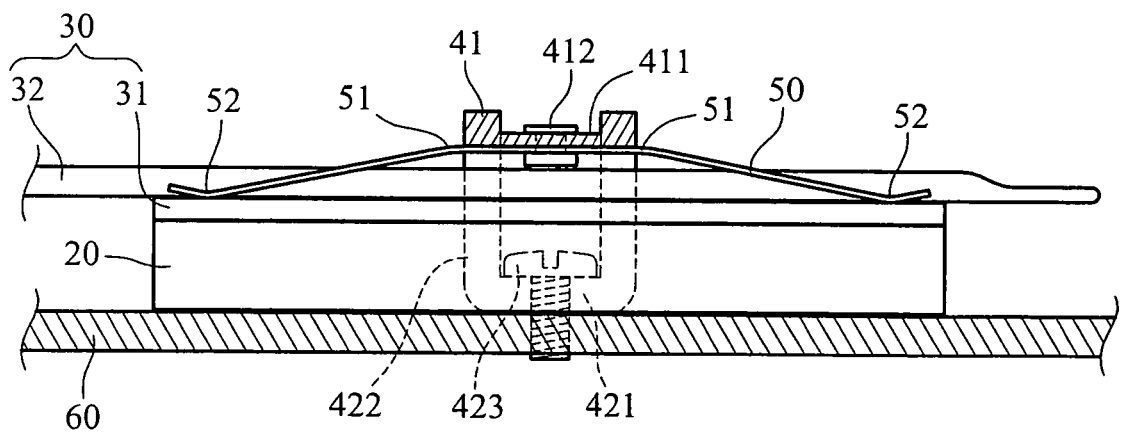
FIG. 5 is a cross-sectional view of the heat plate fixing structure of FIG. 4.

As shown in FIG. 2, it is an exploded stereogram of a heat plate fixing structure 10 according to a first embodiment of the present invention. As shown in FIG. 3, it is an exploded stereogram of an embodiment of the heat plate fixing structure 10 of FIG. 2 further provided with a combining plate 421 and a reinforcing plate 422. As shown in FIG. 4, it is an integrated stereogram of a heat plate fixing structure 10 according to an embodiment of the present invention. As shown in FIG. 5, it is a cross-sectional view of the heat plate fixing structure 10 of FIG. 4.

Referring to FIGS. 2, 3, 4, and 5, the present embodiment is a heat plate fixing structure 10, applied to the heatsink structure 30 of the heating element 20 for an electronic device. The heatsink structure 30 at least includes a heat plate 31 and at least one heat pipe 32. The heat plate fixing structure 10 includes a support part 40 and at least one fixing piece 50.

The support part 40 is of an inverted U-shaped structure, provided with a top plate 41 and a side plate 42 respectively formed at both sides of the top plate 41. Generally, the support part 40 can be made of a plastic material with excellent heat durability, or other metallic materials. The support part 40 is disposed across both sides of the heat plate 31, for providing support when the fixing piece 50 exerts pressure onto the heat plate 31. Besides, the support part 40 can be fixed onto the circuit board or the body 60 of the electronic device via a gel. Alternatively, when the junction parts between the support part 40 and the circuit board or the body 60 are of materials that can be welded, the support part 40 also can be fixed onto the circuit board or the body 60 of the electronic device by way of welding.

Referring to FIG. 3, the top plate 41 of the support part 40 is further provided with a groove 411 for enhancing the structural strength of the support part 40. Besides, a combining plate 421 can be further disposed at the external side of each side plate 42. A hole is disposed in each of the combining plates 421, such that the support part 40 can be fixed onto the circuit board or the body 60 of the electronic device via a screw 423. To achieve a higher structural strength, at least one reinforcing plate 422 can be further disposed between the combining plate 421 and the side plate 42.

The fixing piece 50 is an elastic sheet, for example, an elastic steel sheet. The top central part of the fixing piece 50 is of a flat shape, so it can be attached to the internal side of the top plate 41 of the support part 40. Besides, the fixing piece 50 can be integrated with the top plate 41 via a rivet 412 or by way of welding. Alternatively, if the support part 40 is a plastic piece, the plastic piece can go through the opening part of the fixing piece 50, and then it is melted, such that the fixing piece 50 is fixed onto the support part 40. The fixing piece 50 has a first bent part 51, for providing the fixing piece 50 with a downward bent structure, thereby enabling the fixing piece 50 to exert pressures onto the heat plate 31. Besides, a second bent part 52 is formed at the position where the fixing piece 50 contacts the heat plate 31. When the second bent part 52 contacts the heat plate 31, the contact between the fixing piece 50 and the heat plate 31 can be made much smoother and easier. The fixing piece 50 can be steadily pressed against the four sides of the upper surface of the heat plate 31 via the first bent part 51 and the second bent part 52, such that the heat plate 31 and the heating element 20 are attached to each other tightly.

The Second Embodiment

Figure 6:
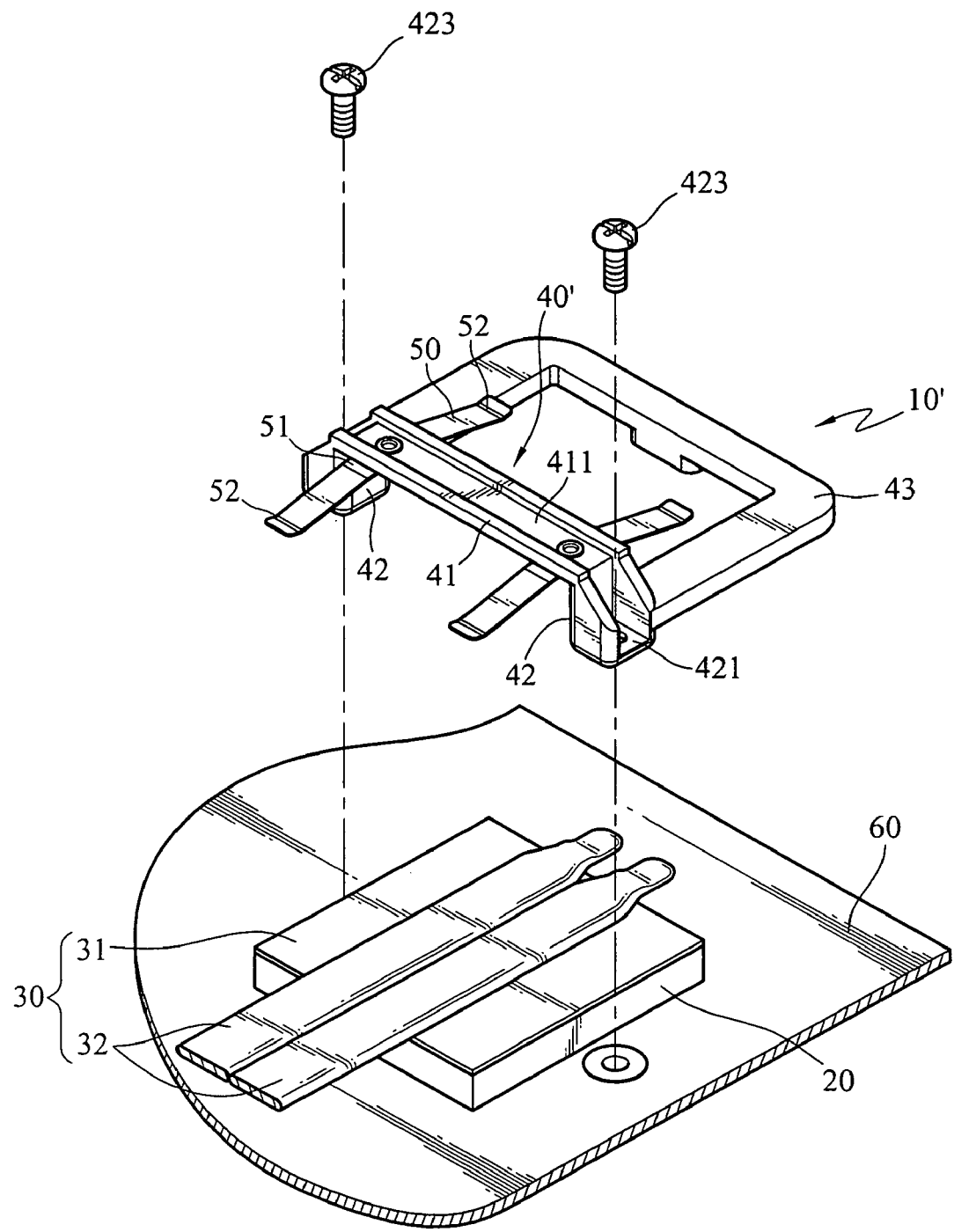
FIG. 6 is an exploded stereogram of a heat plate fixing structure according to a second embodiment of the present invention.

As shown in FIG. 6, it is an exploded stereogram of a heat plate fixing structure 10' according to a second embodiment of the present invention. The present embodiment is a heat plate fixing structure 10', applied to the heatsink structure 30 of the heating element 20 for an electronic device. The heatsink structure 30 at least includes a heat plate 31 and at least one heat pipe 32. The heat plate fixing structure 10' includes a support part 40' with a bracket and at least one fixing piece 50.

The support part 40' with a bracket is also of an inverted U-shaped structure, provided with a top plate 41, side plates 42 respectively formed at both sides of the top plate 41, and a bracket 43 further formed at one side of the side plates 42. The support part 40' with a bracket is disposed across the external side of the heat plate 31 and fixed onto the circuit board or the body 60 of the electronic device.

The support part 40' with a bracket is generally made of plastic materials with the excellent heat durability, or other metallic materials. The support part 40' is disposed across the external side of the heat plate 31, for providing support when the fixing piece 50 exerts pressures onto the heat plate 31. Besides, the support part 40' with a bracket can be fixed onto the circuit board or the body 60 of the electronic device via a gel. Alternatively, when the junction parts between the support part 40' with a bracket and the circuit board or the body 60 are of materials that can be welded, the support part 40' with a bracket also can be fixed onto the circuit board or the body 60 of the electronic device by way of welding. As the bracket 43 can be attached to the circuit board or the body 60 of the electronic device, the fixing area for the support part 40' with a bracket can be significantly enlarged, such that the structure of the support part 40' with a bracket is much steadier.

Similarly, as shown in FIG. 3, a groove 411 can be further disposed in the top plate 41 of the support part 40' with a bracket for enhancing the structural strength. Besides, a combining plate 421 can be further disposed at the external side of each side plate 42. A hole is disposed in each combining plate 421, such that the support part 40' with a bracket can be fixed onto the circuit board or the body 60 of the electronic device via a screw 423. Furthermore, to achieve a higher structural strength, at least one reinforcing plate 422 can be further disposed between the combining plate 421 and the side plate 42.

The fixing piece 50 is an elastic sheet, for example, an elastic steel sheet. The top central part of the fixing piece 50 is of a flat shape, so it can be attached to the internal side of the top plate 41 of the support part 40' with a bracket. Besides, the fixing piece 50 can be integrated with the top plate 41 via a rivet 412 or by way of welding. Alternatively, if the support part 40' with a bracket is a plastic piece, the plastic piece can go through the opening part of the fixing piece 50, and then it is melted, such that the fixing piece 50 is fixed onto the support part 40' with a bracket. The fixing piece 50 has a first bent part 51, for providing the fixing piece 50 with a downward bent structure, thereby enabling the fixing piece 50 to exert pressures onto the heat plate 31. Besides, a second bent part 52 is formed at the position where the fixing piece 50 contacts the heat plate 31. When the second bent part 52 contacts the heat plate 31, the contact between the fixing piece 50 and the heat plate 31 can be made much smoother and easier. The fixing piece 50 can be steadily pressed against the four sides of the upper surface of the heat plate 31 through the first bent part 51 and the second bent part 52, such that the heat plate 31 and the heating element 20 are attached to each other tightly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat plate fixing structure, applied to a heatsink structure of a heating element for an electronic device, wherein the heatsink structure at least includes a heat plate and at least one heat pipe, the heat plate fixing structure comprising:
    a support part of an inverted U-shaped structure, including a top plate and two side plates formed at both sides of the top plate, respectively, wherein the support part is disposed across both sides of the heat plate and is fixed onto a circuit board or a body of the electronic device; and
    at least one fixing piece, being an elastic sheet, including a top end fixed onto an internal side of the top plate, the at least one fixing piece being bent downward at two sides of the top end to form two first bent parts, respectively, the fixing piece further including two second bent parts to contact and press against two corners of an upper surface of the heat plate, for making the heat plate and the heating element attached to each other tightly.

2. The heat plate fixing structure according to claim 1, wherein a combining plate is further disposed at an external side of each of the side plates.

3. The heat plate fixing structure according to claim 2, wherein a hole is disposed in the combining plate.

4. The heat plate fixing structure according to claim 2, wherein at least one reinforcing plate is disposed between the combining plate and the side plate.

5. The heat plate fixing structure according to claim 1, wherein the top plate is provided with a groove.

6. A heat plate fixing structure, applied to a heatsink structure of a heating element for an electronic device, wherein the heatsink structure at least includes a heat plate and at least one heat pipe, the heat plate fixing structure comprising:
    a support part with a bracket, including a top plate and two side plates formed at both sides of the top plate, respectively, wherein the support part with the bracket is disposed across the external side of the heat plate and is fixed onto a circuit board or a body of the electronic device; and
    at least one fixing piece, being an elastic sheet, including a top end fixed onto an internal side of the top plate, the at least one fixing piece being bent downward at two sides of the top end to form two first bent parts, respectively, the fixing piece further including two second bent parts to contact and press against two corners of an upper surface of the heat plate, such that the heat plate and the heating element are attached to each other tightly.

7. The heat plate fixing structure according to claim 6, wherein a combining plate is further disposed at an external side of each of the side plates.

8. The heat plate fixing structure according to claim 7, wherein a hole is disposed in the combining plate.

9. The heat plate fixing structure according to claim 7, wherein at least one reinforcing plate is disposed between the combining plate and the side plate.

10. The heat plate fixing structure according to claim 6, wherein the top plate is provided with a groove.

* * * * *